(12) United States Patent
Bocirnea

(10) Patent No.: US 8,384,566 B2
(45) Date of Patent: Feb. 26, 2013

(54) PRESSURE-SENSITIVE KEYBOARD AND ASSOCIATED METHOD OF OPERATION

(75) Inventor: Radu Catalin Bocirnea, New Westminster (CA)

(73) Assignee: McKesson Financial Holdings

( * ) Notice: Subject to any disclaimer, the term of this patent is extended or adjusted under 35 U.S.C. 154(b) by 344 days.

(21) Appl. No.: 12/783,376

(22) Filed: May 19, 2010

(65) Prior Publication Data

US 2011/0285555 A1 Nov. 24, 2011

(51) Int. Cl.
*H03M 11/00* (2006.01)
(52) U.S. Cl. ............. 341/34; 341/22; 341/26; 345/168; 345/169; 345/171; 345/172; 345/173
(58) Field of Classification Search .............. 341/22–34; 345/168–173
See application file for complete search history.

(56) References Cited

U.S. PATENT DOCUMENTS

| | | | |
|---|---|---|---|
| 5,231,380 A | 7/1993 | Logan | |
| 5,463,388 A | 10/1995 | Boie et al. | |
| 5,675,361 A | 10/1997 | Santilli | |
| 6,025,726 A | 2/2000 | Gershenfeld et al. | |
| 6,204,839 B1 | 3/2001 | Mato, Jr. | |
| 6,307,548 B1* | 10/2001 | Flinchem et al. ............. 715/811 |
| 7,123,241 B2 | 10/2006 | Bathiche | |
| 7,151,528 B2 | 12/2006 | Taylor et al. | |
| 7,193,613 B2 | 3/2007 | Jam | |
| 7,616,191 B2* | 11/2009 | Matta ............................ 345/168 |
| 7,719,520 B2* | 5/2010 | Singh et al. ..................... 345/169 |
| 2004/0198249 A1* | 10/2004 | Grifffin ........................ 455/90.3 |
| 2005/0200609 A1* | 9/2005 | Van der Hoeven ........... 345/169 |
| 2006/0232557 A1 | 10/2006 | Fallot-Burghardt | |
| 2007/0070052 A1 | 3/2007 | Westerman et al. | |
| 2010/0039393 A1* | 2/2010 | Pratt et al. ...................... 345/173 |
| 2011/0050576 A1* | 3/2011 | Forutanpour et al. ......... 345/168 |
| 2011/0074686 A1* | 3/2011 | Causey et al. ................. 345/168 |
| 2011/0074691 A1* | 3/2011 | Causey et al. ................. 345/169 |
| 2012/0075194 A1* | 3/2012 | Ferren ............................ 345/168 |

OTHER PUBLICATIONS

Sensitronics LLC; Force Sensing Resistor (2 pgs.) http://www.sensitronics.com/products/force_sensing_resistor.htm site visited May 11, 2010.
Interlink Electronics; Standard Sensors; Standard FSR Solutions (1 pg.) http://www.interlinkelectronics.com/force_sensors/products/forcesensingresistors/standardsensors.html site visited May 11, 2010.
Paratech Limited; QTC Technology; Pressure-sensing and Switching http://peratech.com/qtctechnology.php site visited May 11, 2010.
Lion Precision Tech Note; Capacitive Sensor Operation and Optimization; LT03-0020; Feb. 2009 (5 pgs.).
Capacitive Proximity Sensors Theory of Operation 3 pgs.

* cited by examiner

*Primary Examiner* — Linh Nguyen
(74) *Attorney, Agent, or Firm* — Alston & Bird LLP

(57) ABSTRACT

An apparatus is provided that includes a processor to at least perform or cause the apparatus to at least perform a number of operations. These operations include receiving pressure-measurement signals from a keyboard including an arrangement of keys, and a plurality of pressure sensors associated with a respective plurality of the keys. In this regard, the pressure sensors are configured to measure a pressure applied to the respective plurality of the keys, and produce the pressure-measurement signals representative of the measured pressure. The operations also include predicting one or more next keystrokes on the keyboard as a function of the pressure-measurement signals, and determining one or more commands or instructions for directing performance of one or more operations of an apparatus or software operating on the apparatus, where the command(s) or instruction(s) are determined as a function of the predicted next keystroke(s).

24 Claims, 5 Drawing Sheets

PRESSURE-SENSITIVE KEYBOARD AND ASSOCIATED METHOD OF OPERATION

FIELD OF THE INVENTION

The present invention generally relates to a user interface and methods for interacting with a computer system, and more particularly, to a pressure-sensitive keyboard and associated method of interacting with a computer system using the same.

BACKGROUND OF THE INVENTION

In the field of medical imaging, prior to the digitization of medical imaging, medical-imaging users (e.g., Radiologists) would analyze physical film printed images in light boxes, and use physical devices such as magnifying glasses, rulers, grease pencils, and their hands to manipulate the physical printed medical images in order to interpret and diagnose the images. With the digitization of medical imaging, the physical film became a digital image, displayable on a computer monitor. A medical-imaging system became a computer application or collection of computer applications, which require a computer or computers to operate. At present, medical-imaging systems are interacted with through a mouse and keyboard. Commands to the medical-imaging system are typically invoked through mouse and/or keyboard interactions.

For alphanumeric text entry, and initiating commands, keyboards have remained much the same for many decades and it has been difficult to find alternatives that perform better at text entry, for most users. When used as an input device for medical-imaging systems, some form of keyboard may remain in use for text entry for a long time to come. However, another common purpose for which keyboards are used with medical-imaging systems is for shortcuts to operations generally also available with the mouse but at the cost of navigation time and additional mouse clicking.

SUMMARY OF THE INVENTION

In light of the foregoing background, exemplary embodiments of the present invention provide an improved apparatus and method for more intuitively and efficiently interacting with a computer system, such as a medical-imaging system. According to one aspect of exemplary embodiments of the present invention, an apparatus is provided that includes a processor configured to at least perform or cause the apparatus to at least perform a number of operations. These operations include receiving pressure-measurement signals from a keyboard. The keyboard includes an arrangement of keys, and a plurality of pressure sensors associated with a respective plurality of the keys. In this regard, the pressure sensors are configured to measure a pressure applied to the respective plurality of the keys, and produce the pressure-measurement signals representative of the measured pressure.

The operations the processor is configured to perform or cause performance of also include predicting one or more next keystrokes on the keyboard as a function of the pressure-measurement signals. Performing this prediction may include, for example, determining when the pressure-measurement signals from a pressure sensor associated with a respective key indicates an increase in pressure at a rate above a given threshold rate, or indicates a pressure above a given threshold pressure. Additionally or alternatively, for example, the prediction may include predicting one or more next keystrokes based on an inferred probability of a next key to be pressed. The probability of the next key being pressed may be inferred based on the pressure-measurement signals and keyboard utilization patterns, where one or more of the utilization patterns may be acquired through a machine-learning technique.

The processor may be further configured to perform or cause performance of determining one or more commands or instructions for directing performance of one or more operations of an apparatus or software operating on the apparatus. The command(s) or instruction(s) may be determined as a function of the predicted next keystroke(s), but may be determined further as a function of information regarding the software or a type of the software operating on the apparatus, a state and/or a responsiveness of the software or the type of the software.

The command(s) or instruction(s) may, for example, effectuate a change in a graphical output presented by a display during operation of the software operating on the apparatus. Additionally or alternatively, for example, the command(s) or instruction(s) may be those otherwise performed by the apparatus or software in response to an actual keystroke corresponding to the predicted next keystroke. In a more particular example, the command(s) or instruction(s) may initiate an operation by or with another apparatus (e.g., network server) located across a network from the apparatus.

According to other aspects of exemplary embodiments of the present invention, a method and computer-readable storage medium are provided. Exemplary embodiments of the present invention therefore provide an improved apparatus, method and computer-readable storage medium for directing operation of an apparatus or software via a pressure-sensitive keyboard. As indicated above, and explained below, exemplary embodiments of the present invention may solve problems identified by prior techniques and provide additional advantages.

BRIEF DESCRIPTION OF THE DRAWINGS

Figure 1:
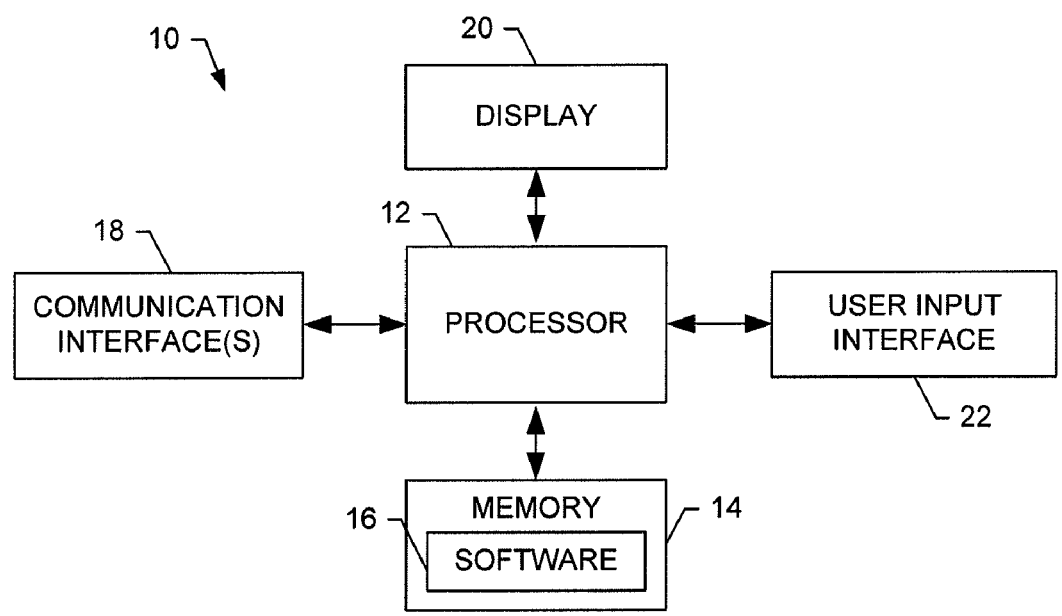
Figure 2:
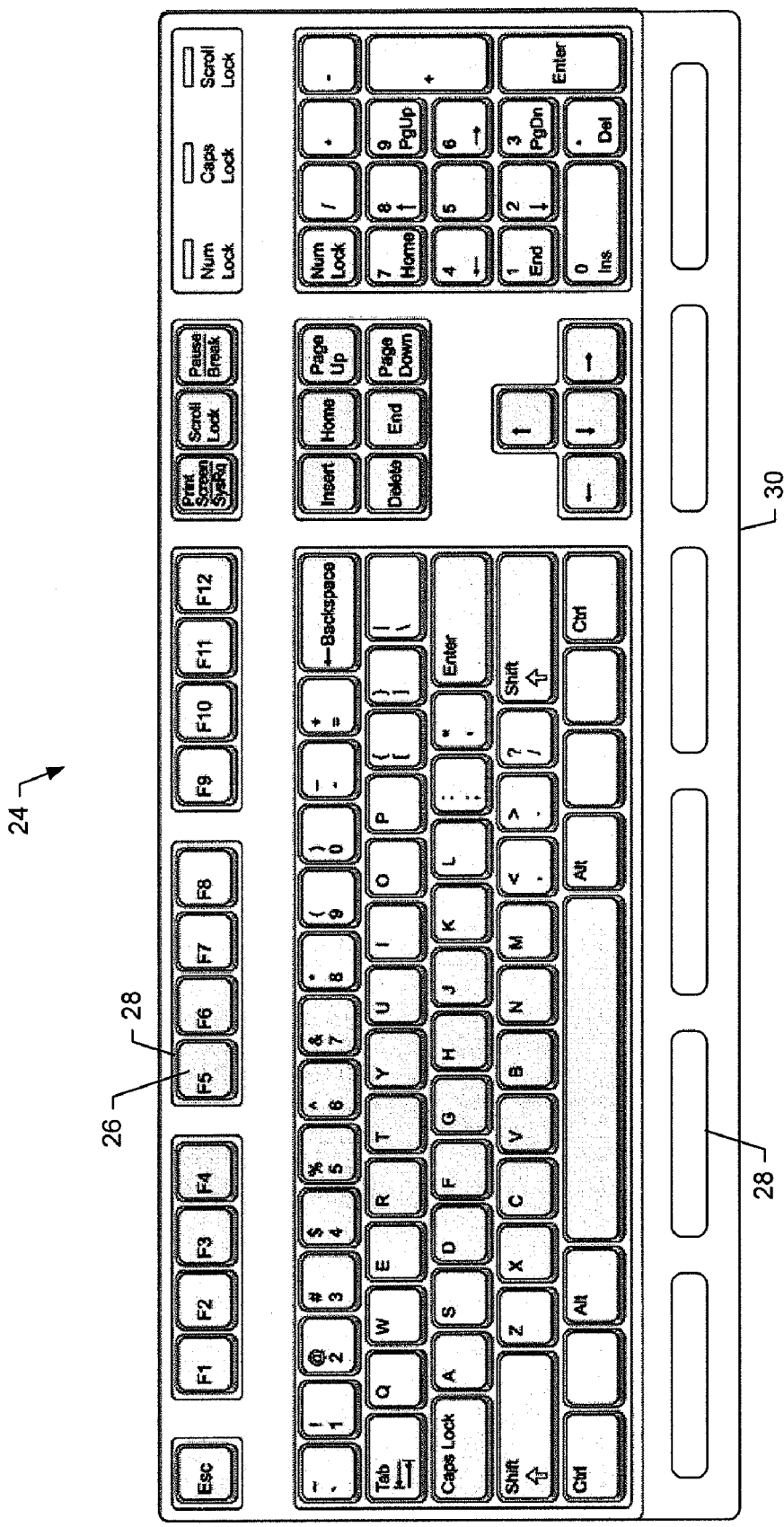
Figure 3:
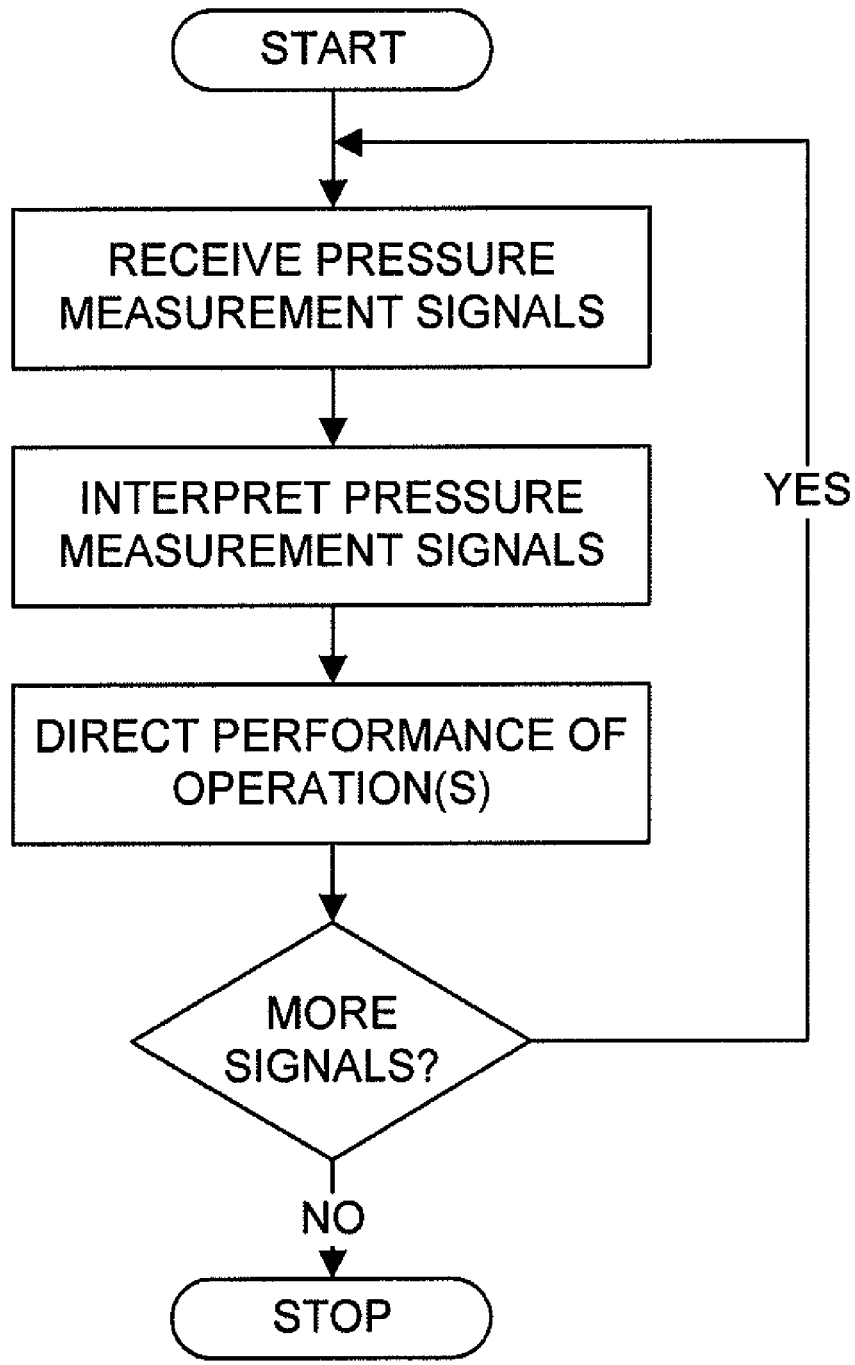

Having thus described the invention in general terms, reference will now be made to the accompanying drawings, which are not necessarily drawn to scale, and wherein:

FIG. 1 is a schematic block diagram of a device configured to operate in accordance with embodiments of the present invention;

FIG. 2 is a schematic diagram of a pressure-sensitive keyboard, according to exemplary embodiments of the present invention;

FIG. 3 is a flowchart illustrating various steps in a method of processing pressure-measurement signals according to exemplary embodiments of the present invention; and FIGS. 4a-4e are a series of schematic diagrams illustrating various steps in a method by which a next keystroke may be predicted, according to exemplary embodiments of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. For example, references may be made herein to directions and orientations including vertical, horizontal, diagonal, right and left; it should be understood, however, that any direction and orientation references are simply examples and that any particular direction or orientation may depend on the particular object, and/or the orientation of the particular object, with which the direction or orientation reference is made. Like numbers refer to like elements throughout.

Referring to FIG. 1, a block diagram of one type of device configured according to exemplary embodiments of the present invention is provided ("exemplary" as used herein referring to "serving as an example, instance or illustration"). The device and method of exemplary embodiments of the present invention will be primarily described in conjunction with medical-imaging applications. It should be understood, however, that the method and device of embodiments of the present invention can be utilized in conjunction with a variety of other applications, both in the medical industry and outside of the medical industry. Further, the device of exemplary embodiments of the present invention includes various means for performing one or more operations in accordance with exemplary embodiments of the present invention, including those more particularly shown and described herein. It should be understood, however, that one or more of the entities may include alternative means for performing one or more like operations, without departing from the spirit and scope of the present invention.

Generally, the device of exemplary embodiments of the present invention may comprise, include or be embodied in one or more fixed electronic devices, such as one or more of a laptop computer, desktop computer, workstation computer, server computer or the like. In a more particular example, the device may comprise, include or be embodied in a picture archiving and communication system (PACS) or other medical-imaging system workstation. Additionally or alternatively, the device may comprise, include or be embodied in one or more portable electronic devices, such as one or more of a mobile telephone, portable digital assistant (PDA), pager or the like.

As shown in FIG. 1, the device 10 of one exemplary embodiment of the present invention may include a processor 12 connected to non-transitory memory 14. The memory can comprise volatile and/or non-volatile memory, and typically stores content, data or the like (the terms "content," "data" or the like may be used interchangeably or may more generally be referred to herein as "information"). In this regard, the memory may store content transmitted from, and/or received by, the device. The memory may also store one or more software applications 16, instructions or the like for the processor to perform steps associated with operation of the entity in accordance with exemplary embodiments of the present invention (although any one or more of these steps may be implemented in hardware alone or in any combination with software and/or firmware). This software may include, for example, a key-prediction and interpretation engine configured to receive and interpret information from a pressure-sensitive keyboard for predicting a future keystroke on the keyboard, and direct performance of one or more operations of the device in response thereto. In addition, the software may include software applications (e.g., medical-imaging software, Internet browser, etc.), one or more operations of which may be directed by the key-prediction and interpretation engine (and, hence, the user of the device via interaction with a touch-sensitive surface).

In addition to the memory 14, the processor 12 may also be connected to at least one interface or other means for displaying, transmitting and/or receiving information. In this regard, the interface(s) may include at least one communication interface 18 or other means for transmitting and/or receiving information, such as to and/or from other device(s) and/or network (s) coupled to the device. In addition to the communication interface(s), the interface(s) may also include at least one user interface that may include one or more wireline and/or wireless (e.g., Bluetooth) earphones and/or speakers, one or more displays 20, and/or a user input interface 22. The user input interface, in turn, may comprise any of a number of wireline and/or wireless devices allowing the entity to receive information from a user, such as a microphone, an image or video capture device, a keyboard or keypad, a joystick, or other input device.

As shown in FIG. 2, according to a more particular exemplary embodiment, the user input interface 22 may include a pressure-sensitive keyboard 24. Similar to a conventional keyboard, the pressure-sensitive keyboard includes an arrangement of buttons or keys 26 (key generally referring to a button or key), and may include a processor (and memory) and circuitry configured to interpret keystrokes on the keyboard. In this regard, the keys of the keyboard may be depressed by a user to produce letters, numbers or symbols for input into a software application operating on the device, and/or that may be depressed to effectuate operations of the device or a software application operating on the device. Although described herein as a keyboard, the pressure-sensitive keyboard of exemplary embodiments of the present invention may additionally or alternatively include a keypad or other similar arrangement of keys or buttons.

Generally, the circuitry of the pressure-sensitive keyboard 24 forms a grid of circuits underneath the keys 26 to form a key matrix. The circuits are configured to generate signals in response to the user depressing keys of the keyboard. For example, the circuits may be broken underneath the keys such that, when a user depresses one or more keys, the circuit(s) underneath the respective key(s) is completed; thereby generating signal(s) (e.g., current(s)). The processor receives the signal(s) from the respective circuit(s), and compares the location(s) of the circuit(s) to a character map (lookup table) in its memory to determine how to interpret the keystroke(s). As will be appreciated, although the keyboard may include mechanical-type switches that operate as above, the keyboard may alternatively employ non-mechanical switching techniques such as capacitive switching techniques.

In accordance with exemplary embodiments of the present invention, the circuitry of the pressure-sensitive keyboard 24 further includes a plurality of pressure sensors 28 associated with a respective plurality of keys 26 of the keyboard—although not every key of the keyboard need include a respective pressure sensor. In addition, the pressure-sensitive keyboard may but need not include one or more pressure sensors associated with a rest pad 30, thereby permitting enhanced knowledge of user hand position and/or utilization of the rest pad as an alternative pressure-sensitive input device. Except as otherwise indicated herein, the pressure sensor(s) associated with the rest pad may be configured and operate in a manner similar to the pressure sensors of the keys of the keyboard.

The pressure sensors 28 may be situated in any of a number of different relationships relative to their respective keys 26, and may comprise any of a number of different types of known sensors configured to measure the pressure applied to respective keys of the keyboard 24 and produce corresponding signals as a function of the measured pressure. For example, the pressure sensors may overlay or lie underneath respective keys of the keyboard, or the pressure sensors may be integrated within the respective keys. Examples of suitable pressure sensors include force sensitive resistors such as those manufactured by Sensitronics LLC or Interlink Electronics, or quantum tunneling composite sensors such as those manufactured by Peratech Ltd.

The pressure sensors 28 of the pressure-sensitive keyboard 24 are configured to produce signals representative of measured pressure applied to respective keys 26 (e.g., with a frequency of 120 Hz)—these signals being generally referred to herein as pressure-measurement signals. As will be appreciated, a certain amount of pressure may be required of a user depressing a key for the key matrix to generate a corresponding signal. The pressure sensors may be capable of measuring pressures similar to this amount of pressure, but may also be capable of measuring pressures less than and/or greater than this pressure. Further, the pressure sensors may be configured to measure pressure applied to a single point or area on respective keys; or one or more of the pressure sensors may be configured to measure pressure applied to multiple points or areas on respective key(s) for finer granularity in the pressure-measurement signals. The pressure-measurement signals, then, may be produced and provided in addition to and independent of the interpretation of a keystroke determined by the processor of the keyboard.

In accordance with exemplary embodiments of the present invention, the pressure-sensitive keyboard 24 may be configured to provide pressure-measurement signals and any keystroke interpretations to the device 10. Referring to FIG. 3, the key-prediction and interpretation engine (software 16) of the device may be configured to receive and interpret the respective pressure-measurement signals (and possibly also the keystroke interpretations) into commands or other instructions for directing performance of one or more operations of the device 10, or more particularly in various instances, operations of other software operating on the device. In various instances, execution of these functions may effectuate a change in a graphical output presented by the display 12 during operation of the other software.

The key-prediction and interpretation engine (software 16) may be configured to interpret the pressure-measurement signals (and possibly also the keystroke interpretations) and direct performance of one or more operations of the device as a function of the respective information, alone or in combination with one or more other factors or variables. An example of a factor that may be taken into account by the key-prediction and interpretation engine may be the physiology and range of movement of the human hand.

An example of a variable that may be taken into account by the key-prediction and interpretation engine (software 16) includes information regarding the particular user of the pressure-sensitive keyboard 24 so as to permit user-aware processing of information. Another example may include the particular application software or type of application software currently in use (if any) by the device 10, and/or the state and/or responsiveness of the particular application software or type of application software currently in use, thereby permitting software-aware processing of information. According to other example embodiments, different types of keyboards may be equipped with pressure sensors 28; and in such instances, information regarding the type of keyboard may constitute another variable, thereby permitting device-aware processing of information. Further examples of variables may include currently-useful or otherwise active or available keys or key combinations, historical information (possibly including prediction error rates, user actions and associated states, or the like), local device status such as processor and/or memory load, and/or network status such as bandwidth, latency and/or connectivity.

The key-prediction and interpretation engine (software 16) of the device 10 may be configured to process (interpret and direct device operations as a function of) the pressure-measurement signals, keystroke interpretations and/or any other factors and/or variables as the engine receives the respective information. Alternatively, however, the engine may be configured to store the information for later processing or analysis by the engine, device or other software of the device. Additionally or alternatively, the device may be configured to transmit the information over a network to one or more other devices, where the information may undergo processing and/or analysis.

The key-prediction and interpretation engine may be configured to process the pressure-measurement signals and any other of the information in any of a number of different manners. For example, the engine may be configured to process the pressure-measurement signals and any other of the information to predict an imminent or next keystroke on the keyboard 24 and direct performance of one or more operations as a function of the predicted next keystroke. Additionally or alternatively, the engine may be configured to process the pressure-measurement signals and any other of the information to determine one or more keys on which the user is exerting pressure at any given time or over a given time period, a sequence of changes in the pressure exerted on one or more keys (e.g., tapping), changes in the location on the keyboard 24 in which one or more fingers touch a given key or keys (e.g., swiping).

The key-prediction and interpretation engine may be configured to predict a next keystroke on the keyboard 24 in any of a number of different manners. For example, the engine may interpret that a key 26 of the keyboard 24 will be next pressed when pressure-measurement signals from the pressure sensor 28 associated with the respective key indicate an increase in pressure at a rate above a given threshold rate, or indicate a pressure above a given threshold pressure. In another example, the engine may take into account the pressure exerted by multiple fingers on various keys and predict a next keystroke based on an inferred probability of the next key to be pressed. In this regard, the engine may infer the probability of the next key to be pressed based on the pressure-measurement signals representative of the pressure exerted by multiple fingers on various keys, and based on keyboard utilization patterns such as typical blind typing patterns.

Typical blind typing patterns and other existing keyboard utilization patterns (e.g., application-specific patterns) may be represented in the algorithm such as by prescription of a set of rules and/or by utilizing any one of a number of existing machine-learning techniques. Any prescribed rules may be preprogrammed into the device 10 or acquired through a machine-learning technique. Also, as suggested above, any prescribed rules may be a function of pressure-measurement signals (and possibly also the keystroke interpretations), alone or in combination with one or more other factors or variables.

The key-prediction and interpretation engine may be further configured to determine any of a number of commands or other instructions for directing performance of one or more operations of the device 10 or other software as a function of the predicted next keystroke or determined one or more keys 26 of the keyboard 24. The operations may include operations designed to further improve the prediction capability the engine, such as by accumulating and analyzing information on a per-user basis, determining per-user behaviour and application usage patterns, or the like.

The operations directed by the key-prediction and interpretation engine may include providing user feedback. For example, the engine may direct the display 20 to present a graphical representation of the user's hands and dynamically present guidance in the context of a blind-typing tutoring application (other software 16). Also, for example, in various instances the keys 26 of the keyboard 24 may be configured to provide feedback—e.g., illumination, in response to being depressed by the user; and in these instances, the operations may include providing the feedback before the feedback would otherwise be provided (in response to an actual keystroke).

Additionally or alternatively, the operations may include one or more operations otherwise performed by the device 10 or other software in response to an actual keystroke (the predicted keystroke enabling performance of the operation(s) before the actual keystroke or even without requiring the actual keystroke). Examples of these operations include initiating a server-side operation and/or information transfer of a high-latency network, and/or initiating a lengthy local operation. Utilizing the time interval between a keystroke prediction and the actual keystroke (or would-be keystroke), the engine directing one or more operations otherwise performed in response to the actual keystroke may achieve an improved perceived performance of the device or other software operating on the device.

Figure 4A:
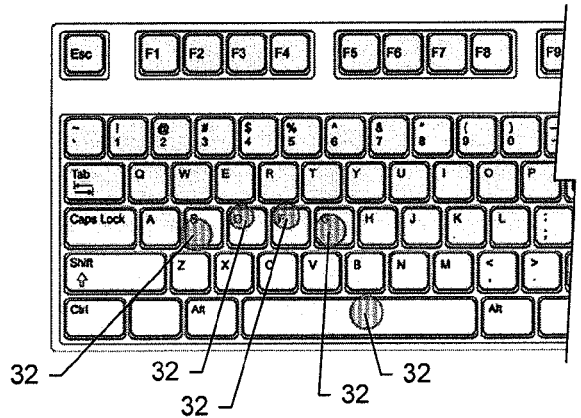
Figure 4B:
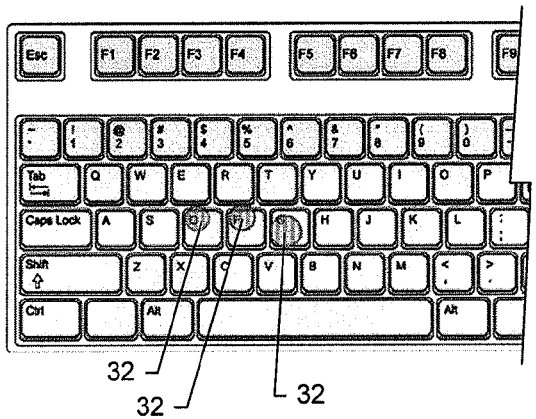

FIGS. 4a-4e more particularly illustrate a method by which the key-prediction and interpretation engine may utilize prescribed rules or machine-learning to predict a next keystroke. As shown, circles 32 represent pressure-measurement signals from pressure sensors 28 associated with keys 26 positioned beneath the respective circles, and the size of a circle represents the strength of the pressure-measurement signals from a respective pressure sensor. As shown in FIG. 4a, the pressure-measurement signals at a first instant indicate the exertion of pressure on five keys of the keyboard, presumably by five fingers of a user' hand. Then, as shown in FIG. 4b at a second instant, the pressure-measurement signals indicate that the user lifted two of their fingers from the keyboard, presumably their little finger and thumb by virtue of the end pressure sensors of the five ceasing to measure a recordable pressure.

Figure 4C:
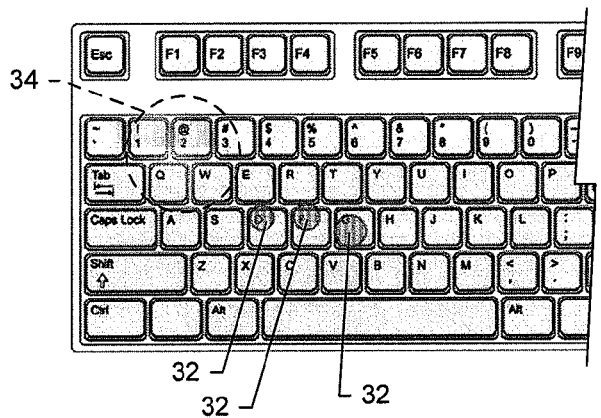
Figure 4D:
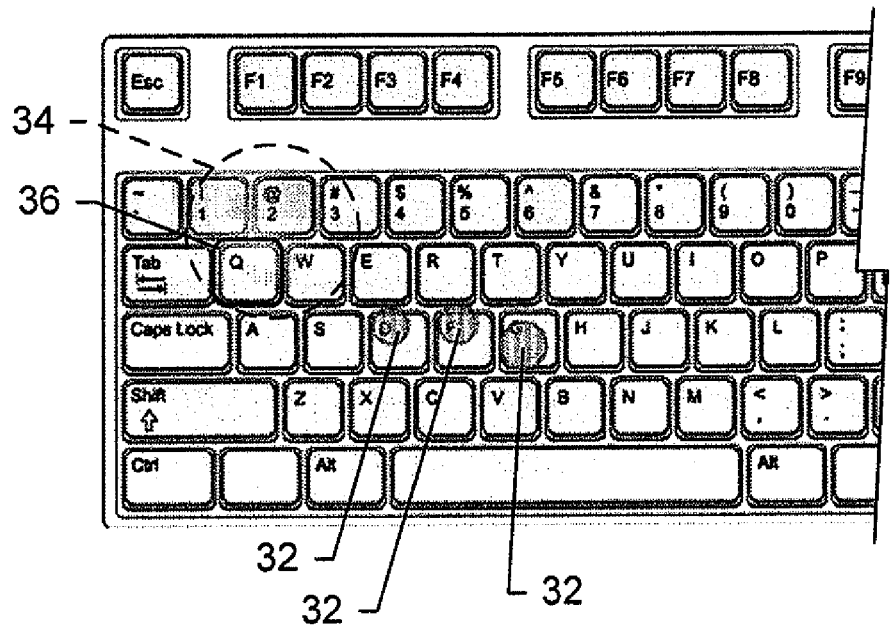
Figure 4E:
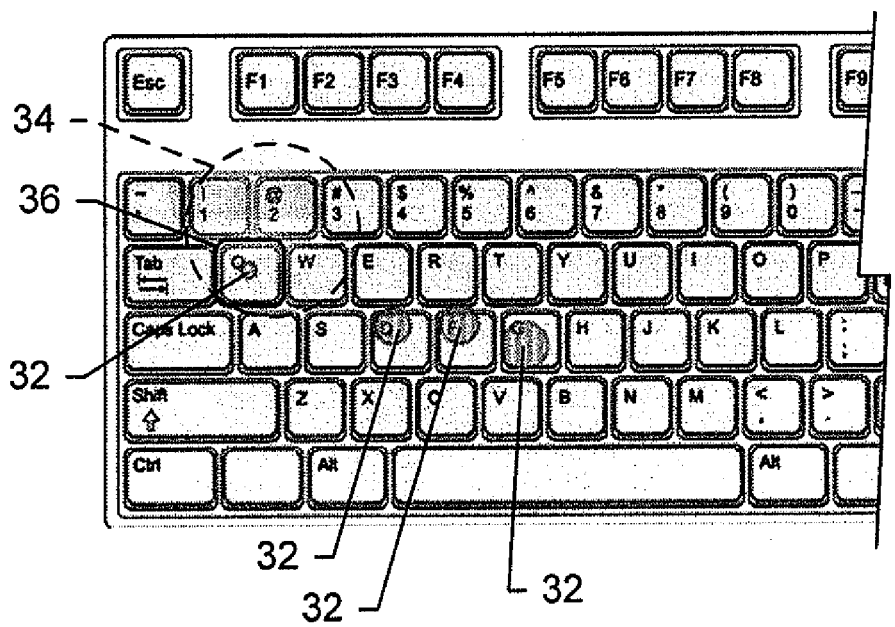

As shown in FIG. 4c, the key-prediction and interpretation engine may interpret the position of the remaining fingers on the keyboard 24 and the presumption as to the particular fingers (index, middle and ring fingers) remaining on the keyboard and identify an area 34 of the keyboard for pressure-measurement signals. This area, and thus the sensors in it, may be defined based on the particular fingers and their position on the keyboard. For example, the area may be defined based on one or more regions of the keyboard accessible to the fingers not on the keyboard considering the physiology and range of movement of the human hand. As shown in FIG. 4d, the engine may then utilize one or more other variables to attempt to even further focus the area to point to a particular key 36 within the area, the particular key being the predicted next key to be pressed. In this regard, the engine may identify a key in the area as the predicted next keystroke further based on variables such as active or available key or key combinations that are within the area and recognized by other software currently in use. The engine may then act on the next keystroke prediction before the user presses the key, as shown by the circle 32 in FIG. 4e representing the pressure-measurement signals indicative of the keystroke.

As explained herein, the device 10 and the pressure-sensitive keyboard 24 may each include a processor (e.g., processor 12) configured to perform one or more functions. It should be understood that one or more of the functions of the processor of the device may instead be performed by the processor of the pressure-sensitive keyboard. Likewise, one or more of the functions of the processor of the pressure-sensitive keyboard may instead be performed by the processor of the device. And even further, one or more of the functions of the processor of either or both of the device or pressure-sensitive keyboard may be performed by yet another device, which may be directly or indirectly coupled to the device or pressure-sensitive keyboard, such as via one or more network(s).

According to one aspect of the present invention, all or a portion of an apparatus (e.g., device 10, pressure-sensitive keyboard 24) of exemplary embodiments of the present invention, generally operates under control of a computer program. The computer program for performing the methods of exemplary embodiments of the present invention may include one or more computer-readable program code portions, such as a series of computer instructions, embodied or otherwise stored in a non-transitory computer-readable storage medium, such as the non-volatile storage medium (memory 14).

It will be understood that each step of a method according to exemplary embodiments of the present invention, and combinations of steps in the method, may be implemented by computer program instructions. These computer program instructions may be loaded onto a computer or other programmable apparatus to produce a machine, such that the instructions which execute on the computer or other programmable apparatus create means for implementing the functions specified in the step(s) of the method. These computer program instructions may also be stored in a computer-readable memory that can direct a computer or other programmable apparatus to function in a particular manner, such that the instructions stored in the computer-readable memory produce an article of manufacture including instruction means which implement steps of the method. The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing steps of the method.

Accordingly, exemplary embodiments of the present invention support combinations of means for performing the specified functions, combinations of steps for performing the specified functions and program instruction means for performing the specified functions. It will also be understood that each step or function, and combinations of steps or functions, can be implemented by special purpose hardware-based computer systems which perform the specified functions or steps, or combinations of special purpose hardware and computer instructions.

Many modifications and other embodiments of the invention will come to mind to one skilled in the art to which this invention pertains having the benefit of the teachings presented in the foregoing descriptions and the associated drawings. It should therefore be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. An apparatus comprising a processor configured to at least perform or cause the apparatus to at least perform the following:

receiving pressure-measurement signals from a keyboard comprising an arrangement of keys, the pressure-measurement signals from the keyboard corresponding to a plurality of pressure sensors associated with a respective plurality of the keys, the pressure sensors being configured to measure a pressure applied to the respective plurality of the keys, and produce the pressure-measurement signals representative of the measured pressure;

predicting one or more next keystrokes on the keyboard as a function of the pressure-measurement signals corresponding to the plurality of pressure sensors associated with the respective plurality of the keys; and determining one or more commands or instructions for directing performance of one or more operations of an apparatus or software operating on the apparatus, the one or more commands or instructions being determined as a function of the predicted one or more next keystrokes.

2. The apparatus of claim 1, wherein predicting one or more next keystrokes includes determining when the pressure-measurement signals from a pressure sensor associated with a respective key indicates an increase in pressure at a rate above a given threshold rate, or indicates a pressure above a given threshold pressure.

3. The apparatus of claim 1, wherein predicting one or more next keystrokes includes predicting one or more next keystrokes based on an inferred probability of a next key to be pressed, the probability of the next key being pressed being inferred based on the pressure-measurement signals and keyboard utilization patterns.

4. The apparatus of claim 3, wherein the probability of the next key being pressed is inferred based on keyboard utilization patterns one or more of which is acquired through a machine-learning technique.

5. The apparatus of claim 1, wherein determining one or more commands or instructions includes determining one or more commands or instructions that effectuate a change in a graphical output presented by a display during operation of the software operating on the apparatus.

6. The apparatus of claim 1, wherein determining one or more commands or instructions includes determining one or more commands or instructions otherwise performed by the apparatus or software in response to an actual keystroke corresponding to the predicted next keystroke.

7. The apparatus of claim 6, wherein determining one or more commands or instructions includes determining one or more commands or instructions that initiate an operation by or with another apparatus located across a network from the apparatus.

8. The apparatus of claim 1, wherein determining one or more commands or instructions includes determining one or more commands or instructions further as a function of one or more of information regarding the software or a type of the software operating on the apparatus, a state or a responsiveness of the software or the type of the software.

9. A method comprising:

receiving pressure-measurement signals from a keyboard comprising an arrangement of keys, the pressure-measurement signals from the keyboard corresponding to a plurality of pressure sensors associated with a respective plurality of the keys, the pressure sensors being configured to measure a pressure applied to the respective plurality of the keys, and produce the pressure-measurement signals representative of the measured pressure;

predicting one or more next keystrokes on the keyboard as a function of the pressure-measurement signals corresponding to the plurality of pressure sensors associated with the respective plurality of the keys; and determining one or more commands or instructions for directing performance of one or more operations of an apparatus or software operating on the apparatus, the one or more commands or instructions being determined as a function of the predicted one or more next keystrokes, wherein receiving pressure-measurement signals, predicting one or more next keystrokes and determining one or more commands or instructions are performed by a processor of the apparatus, the processor being configured to receive pressure-measurement signals, predict one or more next keystrokes and determine one or more commands or instructions.

10. The method of claim 9, wherein predicting one or more next keystrokes includes determining when the pressure-measurement signals from a pressure sensor associated with a respective key indicates an increase in pressure at a rate above a given threshold rate, or indicates a pressure above a given threshold pressure.

11. The method of claim 9, wherein predicting one or more next keystrokes includes predicting one or more next keystrokes based on an inferred probability of a next key to be pressed, the probability of the next key being pressed being inferred based on the pressure-measurement signals and keyboard utilization patterns.

12. The method of claim 11, wherein the probability of the next key being pressed is inferred based on keyboard utilization patterns one or more of which is acquired through a machine-learning technique.

13. The method of claim 9, wherein determining one or more commands or instructions includes determining one or more commands or instructions that effectuate a change in a graphical output presented by a display during operation of the software operating on the apparatus.

14. The method of claim 9, wherein determining one or more commands or instructions includes determining one or more commands or instructions otherwise performed by the apparatus or software in response to an actual keystroke corresponding to the predicted next keystroke.

15. The method of claim 14, wherein determining one or more commands or instructions includes determining one or more commands or instructions that initiate an operation by or with another apparatus located across a network from the apparatus.

16. The method of claim 9, wherein determining one or more commands or instructions includes determining one or more commands or instructions further as a function of one or more of information regarding the software or a type of the software operating on the apparatus, a state or a responsiveness of the software or the type of the software.

17. A non-transitory computer-readable storage medium having computer-readable program code portions stored therein that in response to execution by a processor, cause an apparatus to at least perform the following:

receiving pressure-measurement signals from a keyboard comprising an arrangement of keys, the pressure-measurement signals from the keyboard corresponding to a plurality of pressure sensors associated with a respective plurality of the keys, the pressure sensors being configured to measure a pressure applied to the respective plurality of the keys, and produce the pressure-measurement signals representative of the measured pressure;

predicting one or more next keystrokes on the keyboard as a function of the pressure-measurement signals corresponding to the plurality of pressure sensors associated with the respective plurality of the keys; and determining one or more commands or instructions for directing performance of one or more operations of an apparatus or software operating on the apparatus, the one or more commands or instructions being determined as a function of the predicted one or more next keystrokes, wherein receiving pressure-measurement signals, predicting one or more next keystrokes and determining one or more commands or instructions are performed by a processor of the apparatus, the processor being configured to receive pressure-measurement signals, predict one or more next keystrokes and determine one or more commands or instructions.

18. The non-transitory computer-readable storage medium of claim 17, wherein predicting one or more next keystrokes includes determining when the pressure-measurement signals from a pressure sensor associated with a respective key indicates an increase in pressure at a rate above a given threshold rate, or indicates a pressure above a given threshold pressure.

19. The non-transitory computer-readable storage medium of claim 17, wherein predicting one or more next keystrokes includes predicting one or more next keystrokes based on an inferred probability of a next key to be pressed, the probability of the next key being pressed being inferred based on the pressure-measurement signals and keyboard utilization patterns.

20. The non-transitory computer-readable storage medium of claim 19, wherein the probability of the next key being pressed is inferred based on keyboard utilization patterns one or more of which is acquired through a machine-learning technique.

21. The non-transitory computer-readable storage medium of claim 17, wherein determining one or more commands or instructions includes determining one or more commands or instructions that effectuate a change in a graphical output presented by a display during operation of the software operating on the apparatus.

22. The non-transitory computer-readable storage medium of claim 17, wherein determining one or more commands or instructions includes determining one or more commands or instructions otherwise performed by the apparatus or software in response to an actual keystroke corresponding to the predicted next keystroke.

23. The non-transitory computer-readable storage medium of claim 22, wherein determining one or more commands or instructions includes determining one or more commands or instructions that initiate an operation by or with another apparatus located across a network from the apparatus.

24. The non-transitory computer-readable storage medium of claim 17, wherein determining one or more commands or instructions includes determining one or more commands or instructions further as a function of one or more of information regarding the software or a type of the software operating on the apparatus, a state or a responsiveness of the software or the type of the software.

* * * * *